(12) United States Patent
Refaeli et al.

(10) Patent No.: US 9,048,790 B1
(45) Date of Patent: Jun. 2, 2015

(54) METHOD AND APPARATUS FOR POWER REDUCTION

(75) Inventors: Asaf Refaeli, Rishon le zion (IL); Francesco Rezzi, Cava Manara (IT); Giuseppe De Vita, Pisa (IT)

(73) Assignee: Marvell International Ltd., Hamilton (BM)

( * ) Notice: Subject to any disclaimer, the term of this patent is extended or adjusted under 35 U.S.C. 154(b) by 858 days.

(21) Appl. No.: 13/086,933

(22) Filed: Apr. 14, 2011

Related U.S. Application Data

(60) Provisional application No. 61/324,253, filed on Apr. 14, 2010.

(51) Int. Cl.
*H03F 21/00* (2006.01)
*H03F 3/181* (2006.01)

(52) U.S. Cl.
CPC ..................................... *H03F 3/181* (2013.01)

(58) Field of Classification Search
CPC ........ H03F 3/68; H03F 2200/03; H03F 3/181
USPC .................. 381/120, 102, 104, 106, 28, 123; 330/251, 254, 125 R, 124 R, 297; 700/94
See application file for complete search history.

(56) References Cited

U.S. PATENT DOCUMENTS

| 5,200,708 | A | * | 4/1993 | Morris et al. | 330/124 R |
| 7,808,324 | B1 | * | 10/2010 | Woodford et al. | 330/297 |
| 8,183,931 | B2 | * | 5/2012 | Lesso et al. | 330/297 |
| 2010/0164630 | A1 | * | 7/2010 | Witmer et al. | 330/297 |

* cited by examiner

*Primary Examiner* — Lun-See Lao

(57) ABSTRACT

Aspects of the disclosure provide an audio amplification system. The audio amplification system includes an amplifier configured to amplify an audio signal, and a power supply module external to the amplifier that is configured to provide to the amplifier a supply voltage having a voltage level that is selected from at least two possible voltage levels based on an output volume level for the audio signal. In an example, the amplifier is a Class AB amplifier.

21 Claims, 4 Drawing Sheets

METHOD AND APPARATUS FOR POWER REDUCTION

INCORPORATION BY REFERENCE

This application claims the benefit of U.S. Provisional Application No. 61/324,253, "Dynamic SW Charge Pump's Voltage Control" filed on Apr. 14, 2010, which is incorporated herein by reference in its entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Generally, power consumption is one of the dominant concerns facing a user who chooses to use a battery-powered electronic device. In an example, some users use their mobile devices such as MP3 players, phones and tablet computers to play music. Thus a mobile device that has a relatively low power consumption when playing back music may be preferred by some consumers.

SUMMARY

Aspects of the disclosure provide an audio amplification system. The audio amplification system includes an amplifier configured to amplify an audio signal, and a power supply module external to the amplifier that is configured to provide to the amplifier a supply voltage having a voltage level that is selected from at least two possible voltage levels based on an output volume level for the audio signal. In an example, the amplifier is a Class AB amplifier.

In an embodiment, the audio amplification system includes a transducer module configured to reproduce sound waves in response to the amplified audio signal.

According to an aspect of the disclosure, the audio amplification system includes an audio path configured to process the audio signal according to a volume selected for the audio path, and the amplifier is on the audio path. The power supply module is configured to provide the supply voltage having the voltage level adjusted based on the volume selected for the audio path. Further, in an example, the audio amplification system includes a volume selector configured to select the volume for the audio path, and a controller configured to determine the voltage level of the supply voltage based on the volume selected for the audio path. In an embodiment, the controller is configured to store predetermined voltage levels of the supply voltage corresponding to volumes, and determine the voltage level based on the predetermined voltage levels corresponding to volumes. In another embodiment, the controller is configured to determine a gain of the audio path, estimate an expected amplitude of the audio signal output from the audio path, and determine the voltage level of the supply voltage based on the estimation.

Further, in an example, the power supply module includes a charge pump to provide the supply voltage having the voltage level. In another example, the power supply module is configured to switch to a power rail having the voltage level for providing the supply voltage to the amplifier.

Aspects of the disclosure provide a method for amplifying an audio signal. The method includes selecting a voltage level of a supply voltage for driving an amplifier that amplifies the audio signal, from at least two possible voltage levels based on an output volume level for the audio signal.

In an embodiment, the method includes storing predetermined voltage levels of the supply voltage corresponding to volumes, and selecting the voltage level based on the predetermined voltage levels corresponding to volumes.

According to an aspect of the disclosure, the method includes receiving a volume selected for an audio path to process the audio signal. The amplifier is on the audio path. Then, the method includes determining a gain of the audio path, estimating an expected amplitude of the audio signal output from the audio path, and selecting the voltage level of the supply voltage based on the estimation. In an example, the method includes selecting the voltage level of the supply voltage to be larger than the expected amplitude of the audio signal. In another example, the voltage level of the supply voltage is selected to be smaller than the expected amplitude to clip the audio signal.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Figure 1:
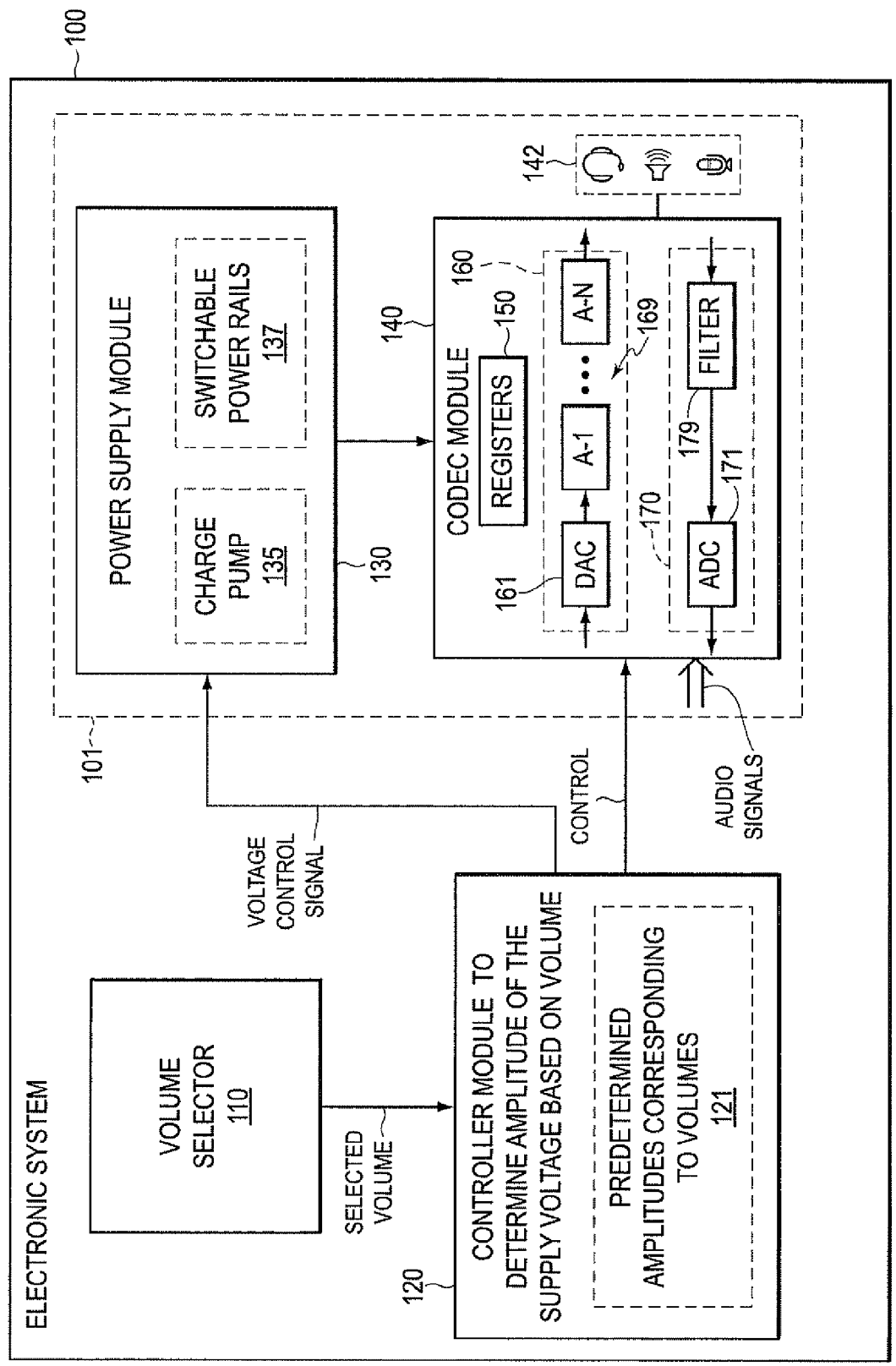
FIG. 1 shows a block diagram of an electronic system example 100 according to an embodiment of the disclosure.

FIG. 1 shows a block diagram of an electronic system example 100 according to an embodiment of the disclosure. The electronic system 100 includes a volume selector 110, a controller module 120, a power supply module 130, an encoder/decoder (CODEC) module 140 and a transducer module 142. These elements are coupled together as seen in FIG. 1.

The electronic system 100 is any suitable electronic system, such as a laptop, a hand held device, tablet computer, a personal digital assistance, a mobile phone, a medium player and the like. In an embodiment, the elements of the electronic system 100 are packaged in a single device, such as a laptop, and the like.

In another embodiment, the elements of the electronic system 100 are packaged into different devices. The different devices can communicate with each other via wired or wireless links. In an example, the transducer module 142 is packaged in a first device having a wire connector, such as a headset with a wire connector, and the like, and the volume selector 110, the controller module 120, the power supply module 130, and the CODEC module 140 are packaged in a second device, such as a handset and the like. The wire connector of the first device is plugged in, for example, a headphone jack of the second device.

In another example, the CODEC module 140, the transducer module 142, and the power supply module 130 that provides power to the CODEC module 140 are packaged in a first device 101, such as a wireless headset. The other elements of the electronic system 100, such as the controller module 120, the volume selector 110, and the like, for example, are packaged in a second device, such as a handset, and the like. It is noted that, in an embodiment, the second device includes a separate power supply module (not shown) that provides power needed for the operation of the second device. Both the first device 101 and the second device have suitable wireless communication interfaces, such as Bluetooth interface modules, and the like. Thus, the first device 101 and the second device can communicate via a wireless link set up between the wireless communication interfaces of the first devices 101 and the second device.

The transducer module 142 includes, in an embodiment, any suitable audio transducers, such as microphone, speaker, headphone, earpieces and the like.

The CODEC module 140 includes, in an embodiment, suitable circuits for processing audio signals, such as converting audio signals from a first format to a second format, filtering out certain frequencies in the audio signals, amplifying the amplitude of the audio signals, and the like. It is noted that the audio signals can be voice signals, music signals, and the like. According to an aspect of the disclosure, the CODEC module 140 includes a plurality of paths for processing the audio signals. For example, the CODEC module 140 includes a first path for processing audio signals for a left earpiece, and a second path for processing audio signals for a right earpiece. In an example, the first path and the second path share at least a portion of path circuits. In another example, the first path and the second path have separate path circuits.

In the FIG. 1 example, the CODEC module 140 includes a decoding path 160. The decoding path 160 includes any suitable circuits to process audio signals in order to reproduce sound waves. For example, the decoding path 160 includes a digital to analog converter (DAC) 161, and an amplifier chain 169 that includes a plurality of amplifiers A-1 to A-N (N is a positive integer number). The DAC 161 converts audio signals from a digital form to an analog form. The amplifier chain 169 amplifies the converted audio signals. Then, the transducer module 142 reproduces sound waves in response to the amplified audio signals. It is noted that the amplitude of the amplified audio signals governs the volume of the sound waves.

The amplifier chain 169 includes various suitable circuit components that affect the amplitude of the amplified audio signals. In an example, one of the circuit components in the amplifier chain 169, such as the amplifier A-N that drives the transducer module 142, is a class AB amplifier. According to an embodiment of the disclosure, a portion of the power provided by the power supply module 130 is not converted to sound waves, and is dissipated by the amplifier chain 169. This portion of the power is a function of a voltage level of the supply voltage provided to the circuit components. For example, a class AB amplifier dissipates more power with a supply voltage of 1.8V than a supply voltage of 0.9V for outputting audio signals with amplitude lower than 0.9V.

It is noted that the CODEC module 140 can include other suitable circuits for audio signal processing. For example, the CODEC module 140 includes an encoding path 170. The encoding path 170 includes an analog to digital converter (ADC) 171 and a filter 179. The CODEC module 140 receives audio signals collected by the transducer module 142. The filter 179 passes certain frequency components of the collected audio signals. The ADC 171 converts the filtered audio signals from an analog form to a digital form.

According to an embodiment of the disclosure, the CODEC module 140 includes registers 150 configured to store control values for the circuit components in the CODEC module 140. The control values can be used to adjust parameters of the paths in the CODEC module 140. In an example, the registers 150 store control values for the plurality of amplifiers A-1 to A-N. The control values correspond to gains of the plurality of amplifiers A-1 to A-N. When the control values are changed, the respective gains of the plurality of amplifiers A-1 to A-n are changed accordingly.

The power supply module 130 is configured to provide power supply to the CODEC module 140. According to an aspect of the disclosure, a supply voltage to at least one circuit component in the CODEC module 140, such as a supply voltage to the amplifier A-N, a supply voltage to the whole amplifier chain 169, and the like, is adjusted based on a selected volume, such as in the form of a percentage of maximum volume, of the electronic system 100.

It is noted that, according to an aspect of the disclosure, the power supply module 130 can use any suitable techniques to provide adjustable voltage levels to the amplifier chain 169.

In an embodiment, the power supply module 130 includes a charge pump 135 to provide a supply voltage to the amplifier chain 169. The charge pump 135 can be controlled to adjust a voltage level of the supply voltage provided to the amplifier chain 169. It is noted that, in an example, the charge pump 135 is configured to provide a positive supply voltage and a negative supply voltage, such as +1.8V and −1.8V, to the amplifier chain 169. The charge pump 135 can be controlled to adjust the voltage level of the positive supply voltage and the voltage level of the negative supply voltage based on the selected volume. In an example, when the selected volume is larger than a threshold, such as 40%, the charge pump 135 provides +1.8V and −1.8V to the amplifier chain 169; otherwise, the charge pump 135 provides +0.9V and −0.9V to the amplifier chain 169.

In another example, the power supply module 130 includes switchable power rails 137. The switchable power rails 137 include power rails of different supply voltages, such as a first pair of power rails of +1.8V and −1.8V, and a second pair of power rails of +0.9V and −0.9V. The switchable power rails 137 can be controlled to switch power rails for providing power supply to, for example, the amplifier chain 169. In an example, when the selected volume is larger than a threshold, such as 40% of maximum volume, the switchable power rails 137 use the first pair of power rails of +1.8V and −1.8V to provide power supply to the amplifier chain 169; otherwise, the switchable power rails 137 switch to the second pair of power rails of +0.9V and −0.9V to provide power supply to the amplifier chain 169.

The volume selector 110 is configured to assist a user of the electronic system 100 to select a volume, such as in the form of a percentage of maximum volume, and the like, for playing back audio signals. It is noted that the volume selector 110 can be any suitable volume selector, such as analog volume selector, digital volume selector, an internal volume selector, a volume selector on a remote control, and the like. It is also noted that, in an example, the volume selector 110 is configured to select respective volumes for a plurality of paths in the CODEC 140 for processing audio signals. When a volume for a path is selected, parameters of the circuits on the path are suitably adjusted according to the volume to make audio signals output from the path having amplitude corresponding to the selected volume. For example, when a volume is selected for the decoding path 160, the control values stored in the registers 150 for the decoding path 160 are changed based on the selected volume. Accordingly, the respective gains of the amplifiers A-1 to A-N, are suitably adjusted.

Then, the audio signals output from the decoding path 160 can drive the transducer module 142 to reproduce sound waves of the selected volume.

The controller module 120 is configured to control the power supply module 130 based on the selected volume. In an embodiment, the controller module 120 receives a signal from the volume selector 110 that is indicative of the selected volume. Based on the selected volume, the controller module 120 determines a voltage level of a supply voltage to, for example, the amplifier chain 169. Then, the controller module 120 sends a voltage control signal to the power supply module 130 that is indicative of the determined voltage level. The power supply module 130 then provides a supply voltage to the amplifier chain 169 responsively to the voltage control signal.

In an embodiment, the controller module 120 includes a memory 121 configured to store predetermined voltage levels of the supply voltage to the amplifier chain 169 corresponding to volumes. Based on the predetermined voltage levels corresponding to volumes, the controller module 120 determines a suitable voltage level corresponding to the selected volume. Then, the controller module 120 sends the voltage control signal that is indicative of the determined voltage level to the power supply module 130. Accordingly, the power supply module 130 provides the supply voltage of the determined voltage level to the amplifier chain 169.

In another embodiment, the controller module 120 estimates the amplitude of the amplified audio signals, and determines the voltage level of the supply voltage based on the estimated amplitude of amplified audio signals. In an example, the controller module 120 accesses the registers 150 in the CODEC module 140, or accesses a copy of the registers 150 to find out the gains on a path, such as the respective gains of the amplifiers A-1 to A-N in the amplifier chain 169. Based on the gains of the amplifiers A-1 to A-N, the controller module 120 estimates a maximum amplitude of the audio signals output from the amplifier chain 169. Then, in an embodiment, the controller module 120 determines a voltage level of the supply voltage to the amplifier chain 169 that supports the maximum amplitude of the audio signals, such as a voltage level of the supply voltage that is larger than the maximum amplitude of the audio signals. It is noted that, in another embodiment, the controller module 120 determines a voltage level of the supply voltage that is smaller than the maximum amplitude of the audio signals to clip the audio signals, for example.

It is also noted that, in an embodiment, the amplitude estimation of the audio signals is performed on the fly so that the power supply module 130 supplies different voltage levels at different times in accordance with an estimated dynamic of the output audio signals.

In an example, the power supply module 130 can provide both 1.8V and 0.9V supply voltages to the amplifier chain 169. At times when the maximum amplitude of the audio signals is less than 0.9V, the controller module 120 determines to use 0.9V supply voltage for the amplifier chain 169. Thus, the power dissipation by the amplifier chain 169 is reduced for the corresponding periods of time. However, at times when the maximum amplitude of the audio signal is larger than 0.9V, the controller module 120 determines to use 1.8V supply voltage for the amplifier chain 169. It is noted that when the power supply module 130 can provide more than two voltage levels of the supply voltage to the amplifier chain 169, the controller module 120 can similarly determine one voltage level, such as a smallest one that is larger than the maximum amplitude of the audio signals, to maintain sound quality and reduce power dissipation.

In another example, the power supply module 130 provides a relatively lower voltage level, such as 0.9V, of the supply voltage based on the selected volume. Further, the controller module 120 keeps tracks of the audio signals, for example, by monitoring the amplitude of the audio signals, or by estimating the amplitude of the audio signals. When the amplitude of the actual audio signals, or the anticipated amplitude of the audio signals exceeds a threshold, the power supply module 130 increases the supply voltage to a relatively higher voltage level, such as 1.8V, and the like. The voltage level then returns following some conditions, e.g., expiration of a timer, or the actual amplitude or the anticipated amplitude of the audio signals receding to below the threshold.

The controller module 120 can be implemented by various techniques. In an embodiment, the controller module 120 is implemented as a processor (not shown) executing program instructions stored in a computer readable memory medium. In an example, the processor is an application processor that also provides digital audio signals to the CODEC module 140 for playing.

During operation, for example, a user adjusts the volume selector 110 to selected a volume for the electronic system 110. The electronic system 110 includes suitable components that adjust the control values stored in the registers 150 according to the selected volume. Then, the control values are used to adjust parameters of the circuit components in the CODEC 140, such as the gains of the amplifiers A-1 to A-N, to output audio signals having the selected volume. In addition, the controller module 120 receives a signal that is indicative of the selected volume. Based on the selected volume, the controller module 120 determines a voltage level of the supply voltage for the amplifiers A-1 to A-N. Then, the controller module 120 sends a voltage control signal indicative of the determined voltage level to the power supply module 130. Accordingly, the power supply module 130 provides the supply voltage having the determined voltage level to the amplifiers A-1 to A-N.

Figure 2A:
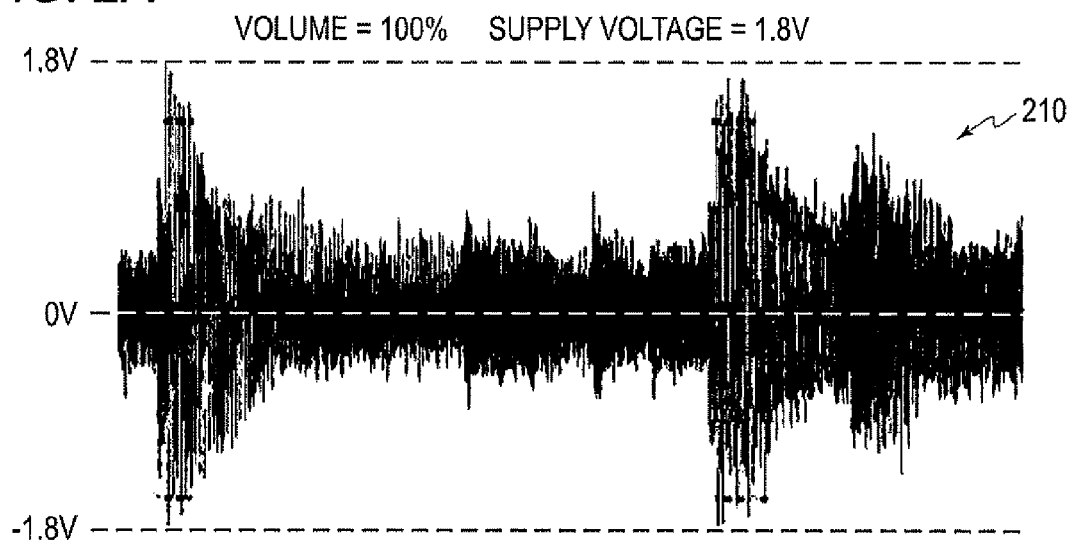
FIGS. 2A and 2B show waveform examples according to an embodiment of the disclosure.
Figure 2B:
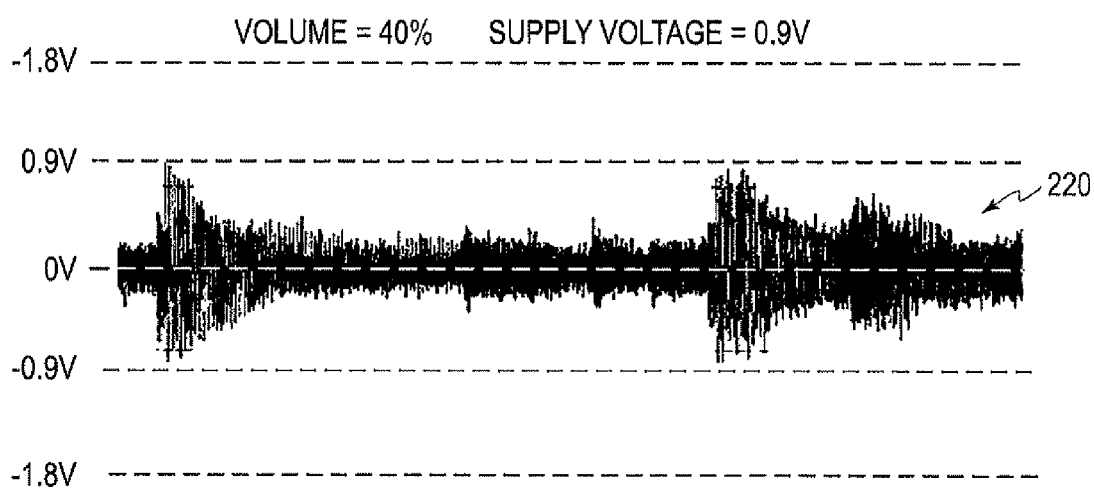

FIGS. 2A and 2B show waveform examples according to an embodiment of the disclosure. FIG. 2A shows a waveform example 210 of audio signals output from the decoding path 160 in FIG. 1 when the volume of the decoding path 160 is selected to be 100%. The waveform 210 has a maximum amplitude closing to 1.8V. Thus, the supply voltage to the amplifier chain 169 has a voltage level of 1.8V to maintain sound quality.

FIG. 2B shows a waveform example 220 of audio signals output from the decoding path 160 in FIG. 1 when the volume of the decoding path 160 is selected to be 40% of maximum volume. In FIG. 2B, the waveform 220 has a maximum amplitude closing to 0.9V. Thus, the supply voltage provided to the amplifier chain 169 has a voltage level of 0.9V. As a result, the amplifier chain 169 dissipates less power than using 1.8V supply voltage.

Figure 3:
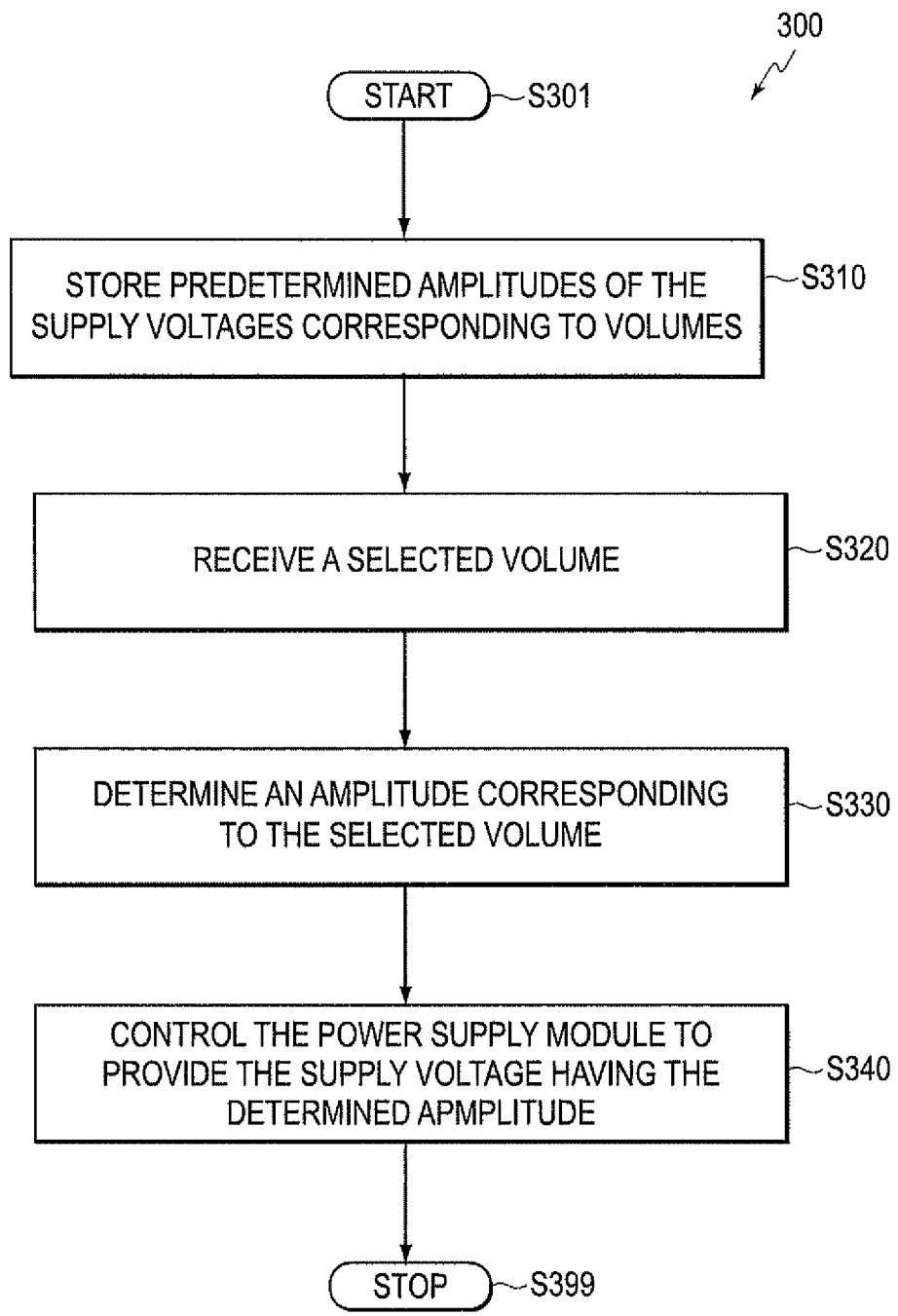
FIG. 3 shows a flow chart outlining a process example 300 for reducing power dissipation according to an embodiment of the disclosure.

FIG. 3 shows a flow chart outlining a process example 300 for reducing power dissipation in the electronic system 100 according to an embodiment of the disclosure. The process 300 starts from S301, and proceeds to S310.

At S310, the controller module 120 stores predetermined voltage levels of the supply voltage for the amplifier chain 169 corresponding to volumes for the decoding path 160. For example, the controller module 120 stores 0.9V corresponding to 40% maximum volume for the decoding path 160. It is noted that the predetermined voltage levels corresponding the volumes can be stored using various techniques, such as a look-up table, a mathematical expression to calculate voltage level as a function of volume, and the like.

In an embodiment, the voltage levels corresponding to the volumes are determined in a calibration stage. In the calibration stage, a volume for the decoding path 160 is selected, for example, using the volume selector 110. Then, the amplitude of the audio signals output from the amplifier chain 169 is measured. Further, a voltage level of the supply voltage is determined based on the measurement. For example, a voltage level that is larger than the maximum amplitude of the audio signals output from the amplifier chain 169 is determined for the supply voltage. It is also noted, in another example, the voltage level that is smaller than the maximum amplitude of the audio signals output from the amplifier chain 169 is determined for the supply voltage that clips the audio signals. Then, the determined voltage level corresponding to the volume is stored in the controller module 120.

At S320, the controller module 120 receives a signal that is indicative of a volume selected for the decoding path 160. In an example, each time when a user uses the volume selector 110 to select a volume for the decoding path 160, or when, based on a calculation such as extrapolation, a volume is anticipated to exceed a threshold volume, the volume selector 110 sends a signal that is indicative of the selected volume to the controller module 120. In another example, base on a calculation, such as extrapolation, a volume change is anticipated to exceed to a threshold, the controller module 120 receives a signal that is indicative of the anticipated volume. It is noted that, the electronic system 100 includes suitable components that adjust parameters of the decoding path 160, such as the gains of the amplifier chain 169, based on the selected volume.

In an example, the control values in the registers 150 that correspond to the gains of the amplifiers A-1 to A-N are adjusted based on the selected volume. Accordingly, the gains of the amplifiers A-1 to A-N are changed. The decoding path 160 then receives audio signals from an audio source, such as from an application processor, a communication processor, and the like. Further, the decoding path 160 processes the received audio signals, and outputs the processed audio signals that can create sound waves of the selected volume. It is noted that audio signals can be transmitted from the audio source to the decoding path 160 by various techniques, such as a wired communication channel, a wireless communication channel, or a combined (wired and wireless) channel.

At S330, the controller module 120 determines a voltage level of the supply voltage for the amplifier chain 169 that corresponds to the selected volume according to the predetermined voltage levels corresponding to volumes.

At S340, the controller module 120 controls the power supply module 130 to provide the supply voltage having the determined voltage level to the amplifier chain 169. In an example, the controller module 120 sends a voltage control signal that is indicative of the determined voltage level to the power supply module 130. The power supply module 130 then provides the supply voltage having the determined voltage level to the amplifier chain 169. In an example, the power supply module 130 controls the charge pump 135 to provide the supply voltage having the determined voltage level. In another example, the power supply module 130 controls the switchable power rails 137 to switch to a power rail that provides the supply voltage having the determined voltage level. Then, the process proceeds to S399 and terminates.

It is noted that the voltage control signal from the controller module 120 to the power supply module 130 can be sent by any suitable communication techniques, such as a wired communication channel, a wireless communication channel, or a combined (wired and wireless) communication channel.

Figure 4:
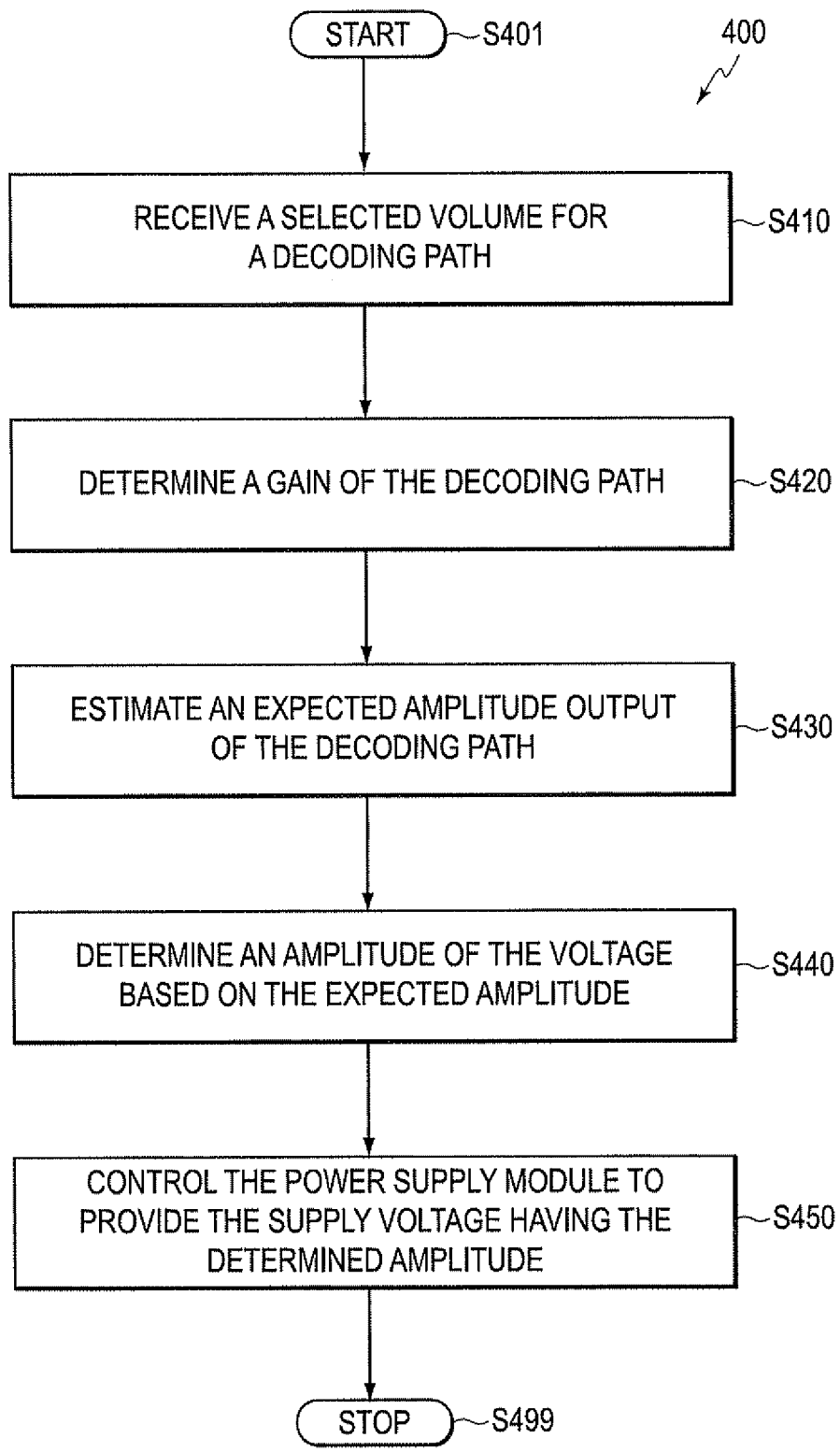
FIG. 4 shows a flow chart outlining another process example 400 for reducing power dissipation according to an embodiment of the disclosure.

FIG. 4 shows a flow chart outlining another process example 400 for reducing power dissipation in the electronic system 100 according to an embodiment of the disclosure. The process starts at S401 and proceeds to S410.

At S410, the controller module 120 receives a signal that is indicative of a volume selected for the decoding path 160 in the CODEC 140. In an example, each time, when a user uses the volume selector 110 to select a volume for the decoding path 160, the volume selector 110 sends a signal that is indicative of the selected volume to the controller module 120. It is noted that, the electronic system 100 includes suitable components that adjust parameters of the decoding path 160, such as the gains of the amplifier chain 169, based on the selected volume.

In an example, the control values in the registers 150 that correspond to the gains of the amplifiers A-1 to A-N are adjusted based on the selected volume. Accordingly, the gains of the amplifiers A-1 to A-N are changed. The decoding path 160 then receives audio signals from an audio source, such as from an application processor, a communication processor, and the like. Further, the decoding path 160 processes the received audio signals, and outputs the processed audio signals that can create sound waves of the selected volume. It is noted that audio signals can be transmitted from the audio source to the decoding path 160 by various techniques, such as a wired communication channel, a wireless communication channel, or a combined (wired and wireless) channel.

At S420, the controller module 120 determines a gain of the amplifier chain 169. In an example, the controller module 120 accesses the registers 150 or a copy of the registers 150 to find out the control values for the amplifiers A-1 to A-N. Based on the control values, the controller module 120 determines the gains of the amplifiers A-1 to A-N, and further determines the gain of the amplifier chain 169.

At S430, the controller module 120 estimates an expected amplitude of the audio signals output from the amplifier chain 169. In an example, the controller module 120 estimates a maximum amplitude of the audio signals output from the amplifier chain 169.

At S440, the controller module 120 determines a voltage level of the supply voltage for the amplifier chain 169 based on the expected amplitude. In an example, the controller module 120 determines a voltage level that is larger than the maximum amplitude from the estimation.

At S450, the controller module 120 controls the power supply module 130 to provide the supply voltage having the determined voltage level to the amplifier chain 169. In an example, the controller module 120 sends a voltage control signal that is indicative of the determined voltage level to the power supply module 130. The power supply module 130 then provides the supply voltage having the determined voltage level to the amplifier chain 169. It is noted that the voltage control signal can be send by any suitable communication techniques, such as a wired communication channel, a wireless communication channel, or a combined (wired and wireless) communication channel. Then, the process proceeds to S499 and terminates.

While the invention has been described in conjunction with the specific embodiments thereof that are proposed as examples, it is evident that many alternatives, modifications, and variations will be apparent to those skilled in the art. Accordingly, embodiments of the invention as set forth herein are intended to be illustrative, not limiting. There are changes that may be made without departing from the scope of the invention.

What is claimed is:

1. An audio amplification system, comprising:
   an amplifier configured to amplify an audio signal;
   a power supply module external to the amplifier that is configured to provide to the amplifier a supply voltage having a voltage level that is selected from at least two possible voltage levels based on an output volume level for the audio signal;
   a software charge pump configured to imitate an operation of adaptive power rails for dynamically controlling the voltage level based on a selected volume by adjusting voltage levels of a positive supply voltage and of a negative supply voltage to fall respectively within a first voltage range or a second voltage range that is different from the first voltage range.

2. The audio amplification system of claim 1, wherein the amplifier is a Class AB amplifier.

3. The audio amplification system of claim 1, further comprising:
   a transducer module configured to reproduce sound waves in response to the amplified audio signal.

4. The audio amplification system of claim 1, further comprising:
   an audio path configured to process the audio signal according to a volume selected for the audio path, wherein the amplifier is on the audio path; and
   the power supply module configured to provide the supply voltage having the voltage level adjusted based on the volume selected for the audio path.

5. The audio amplification system of claim 4, further comprising:
   a volume selector configured to select the volume for the audio path.

6. The audio amplification system of claim 4, further comprising:
   a controller configured to determine the voltage level of the supply voltage based on the volume selected for the audio path.

7. The audio amplification system of claim 6, wherein the controller is configured to store predetermined voltage levels of the supply voltage corresponding to volumes, and determine the voltage level based on the predetermined voltage levels corresponding to volumes.

8. The audio amplification system of claim 6, wherein the controller is configured to determine a gain of the audio path, estimate an expected amplitude of the audio signal output from the audio path, and determine the voltage level of the supply voltage based on the estimation.

9. The audio amplification system of claim 4, further comprising:
   registers configured to store control values that control the audio path.

10. The audio amplification system of claim 1, wherein the power supply module comprises a charge pump to provide the supply voltage having the voltage level.

11. The audio amplification system of claim 1, wherein the power supply module is configured to switch to a power rail having the voltage level for providing the supply voltage to the amplifier.

12. The audio amplification system of claim 1, wherein the voltage levels of the positive voltage supply and the negative voltage supply are adjusted to fall within the first voltage range when the selected volume is larger than a threshold and to fall within the second voltage range when the selected volume is equal to or less than the threshold.

13. A method for amplifying an audio signal, comprising:
   selecting a voltage level of a supply voltage for driving an amplifier that amplifies the audio signal, from at least two possible voltage levels based on an output volume level for the audio signal; and
   imitating an operation of adaptive power rails by a software charge pump for dynamically controlling the voltage level based on a selected volume by adjusting voltage levels of a positive supply voltage and of a negative supply voltage to respectively fall within a first voltage range or a second voltage range that is different from the first voltage range.

14. The method of claim 13, wherein selecting the voltage level of the supply voltage for driving the amplifier that amplifies the audio signal further comprises:
   selecting the voltage level of the supply voltage for driving a Class AB amplifier that amplifies the audio signal.

15. The method of claim 13, further comprising:
   storing predetermined voltage levels of the supply voltage corresponding to volumes; and
   selecting the voltage level based on the predetermined voltage levels corresponding to volumes.

16. The method of claim 13, further comprising:
   receiving a volume selected for an audio path to process the audio signal that the audio path includes the amplifier.

17. The method of claim 16, further comprising:
   determining a gain of the audio path;
   estimating an expected amplitude of the audio signal output from the audio path; and
   selecting the voltage level of the supply voltage based on the estimation.

18. The method of claim 17, wherein selecting the voltage level of the supply voltage based on the estimation further comprises:
   selecting the voltage level of the supply voltage to be larger than the expected amplitude of the audio signal.

19. The method of claim 13, further comprising:
   controlling a power supply source to switch to a power rail having the determined voltage level.

20. The method of claim 13, further comprising:
   controlling a charge pump to generate the supply voltage having the determined voltage level.

21. A computer readable medium storing program instructions for causing a processor to execute operations, the operations comprising:
   selecting a voltage level of a supply voltage for driving an amplifier that amplifies an audio signal, from at least two possible voltage levels based on an output volume level for the audio signal; and
   imitating an operation of adaptive power rails by a software charge pump for dynamically controlling the voltage level based on a selected volume by adjusting voltage levels of a positive supply voltage and of a negative supply voltage to respectively fall within a first voltage range or a second voltage range that is different from the first voltage range.

* * * * *